United States Patent [19]

Gabor et al.

[11] Patent Number: 5,322,711
[45] Date of Patent: Jun. 21, 1994

[54] CONTINUOUS METHOD OF COVERING INORGANIC FIBROUS MATERIAL WITH PARTICULATES

[75] Inventors: Thomas Gabor, Maplewood; James M. O'Kelly, St. Paul; Chris J. Goodbrake, Inver Grove Heights; Joseph H. Eaton, St. Paul, all of Minn.

[73] Assignee: Minnesota Mining and Manufacturing Company, St. Paul, Minn.

[21] Appl. No.: 464,283

[22] Filed: Jan. 12, 1990

Related U.S. Application Data

[63] Continuation-in-part of Ser. No. 383,923, Jul. 21, 1989.

[51] Int. Cl.$^5$ .............................................. C23C 16/00
[52] U.S. Cl. .................................... 427/249; 427/255.2
[58] Field of Search ...... 156/610, 613, 614, DIG. 112; 427/249, 250, 252, 255.1, 255.2, 255.4

[56] References Cited

U.S. PATENT DOCUMENTS

| | | | |
|---|---|---|---|
| 3,212,926 | 10/1965 | Morelock | 117/126 |
| 3,346,414 | 10/1967 | Ellis et al. | 117/106 |
| 3,549,424 | 12/1970 | Rice | 148/63 |
| 3,580,731 | 5/1971 | Milewski et al. | 117/66 |
| 3,668,062 | 6/1972 | Shyne et al. | 161/177 |
| 4,068,037 | 1/1978 | Debolt et al. | 428/368 |
| 4,214,037 | 7/1980 | Galasso et al. | 428/367 |
| 4,343,836 | 8/1982 | Newkirk et al. | 427/249 |
| 4,373,006 | 2/1983 | Galasso et al. | 428/368 |
| 4,642,271 | 2/1987 | Rice | 428/698 |
| 4,731,298 | 3/1988 | Shindo et al. | 428/611 |
| 4,732,779 | 3/1988 | Towata et al. | 427/57 |
| 4,756,791 | 6/1988 | D'Angelo et al. | 156/610 |
| 5,187,021 | 2/1693 | Vyrda et al. | 428/607 |

FOREIGN PATENT DOCUMENTS

| | | |
|---|---|---|
| 0249927 | 10/1985 | European Pat. Off. . |
| 0222960 | 11/1985 | European Pat. Off. . |
| 0184317 | 6/1987 | European Pat. Off. . |
| 2607840 | 12/1986 | France . |
| 61-257000 | 11/1986 | Japan ............ 156/DIG. 112 |
| 61-291498 | 12/1986 | Japan ............ 156/DIG. 112 |
| 62-003098 | 1/1987 | Japan ............ 156/DIG. 112 |

OTHER PUBLICATIONS

Tibbetts et al., "Carbon fibers Grown From the Vapor Phase: A Novel Material", SAMPE Journal, Sep./Oct. 1986, pp. 30–35.

Christiansen et al., "Turbulent Jets in chemical Vapor Deposition", Chemical Engineering Progress, Dec. 1988, pp. 18–22.

Egashira et al., Preparation of Carbonaceous Material Whiskerized with Carbon Fibers (Part 3), Sekiyu Gakkaishi, vol. 28, No. 5 (1985) p. 412.

"Speciality Ceramics & Composites in Ube Group" (1988), p. 3.

Blocher, Jr., J. M., "Deposition Technologies for Films and Coatings", Noyes Publications, pp. 335–364 (1982).

Honjo et al., Composite Interfaces, Proc. Int. Conf. 1st., pp. 101–107 (1986).

Aggour et al., Carbon, vol. 12, pp. 358–362 (1974).

Amateau, J. Compos. Mater., vol. 10, pp. 279–296 (1976).

Kato et al, J. of Cryst. Growth, vol. 37 (1977) pp. 293–300.

Primary Examiner—Peter A. Nelson
Attorney, Agent, or Firm—Gary L. Griswold; Walter N. Kirn; Jeffrey L. Wendt

[57] ABSTRACT

To inhibit agglomeration of fibrous material during composite preparation and to increase transverse strength, particulates such as whiskers have been attached to the fibrous material. Whiskers can be economically grown on the fibrous material while it is transported lengthwise through a heated gaseous mixture under APCVD conditions and the presence of an agent for catalyzing the formation of whiskers. The fibrous material preferably is a roving or tow of a ceramic or carbon.

15 Claims, 7 Drawing Sheets

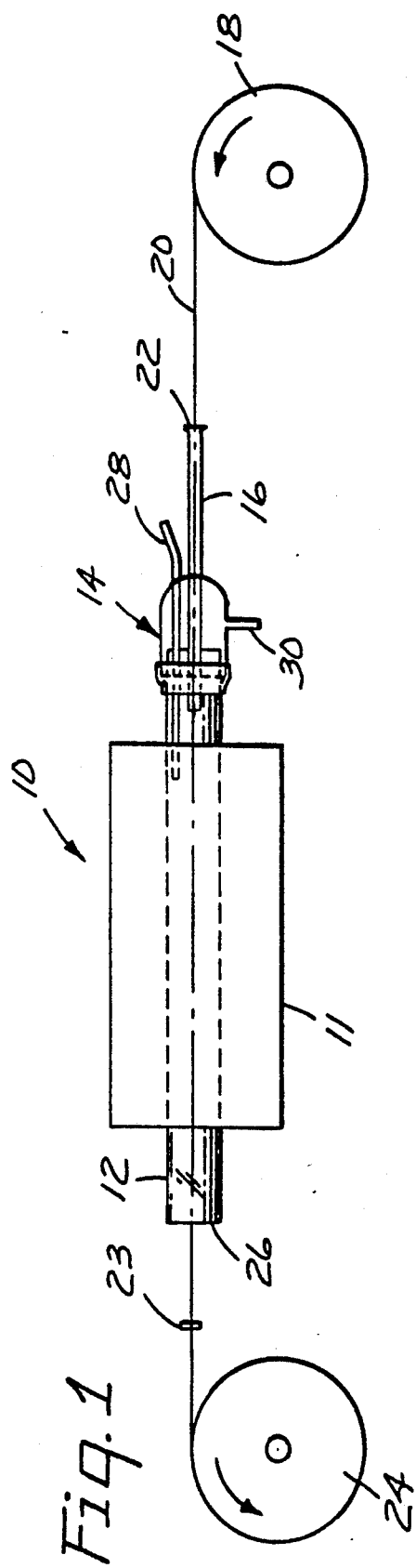

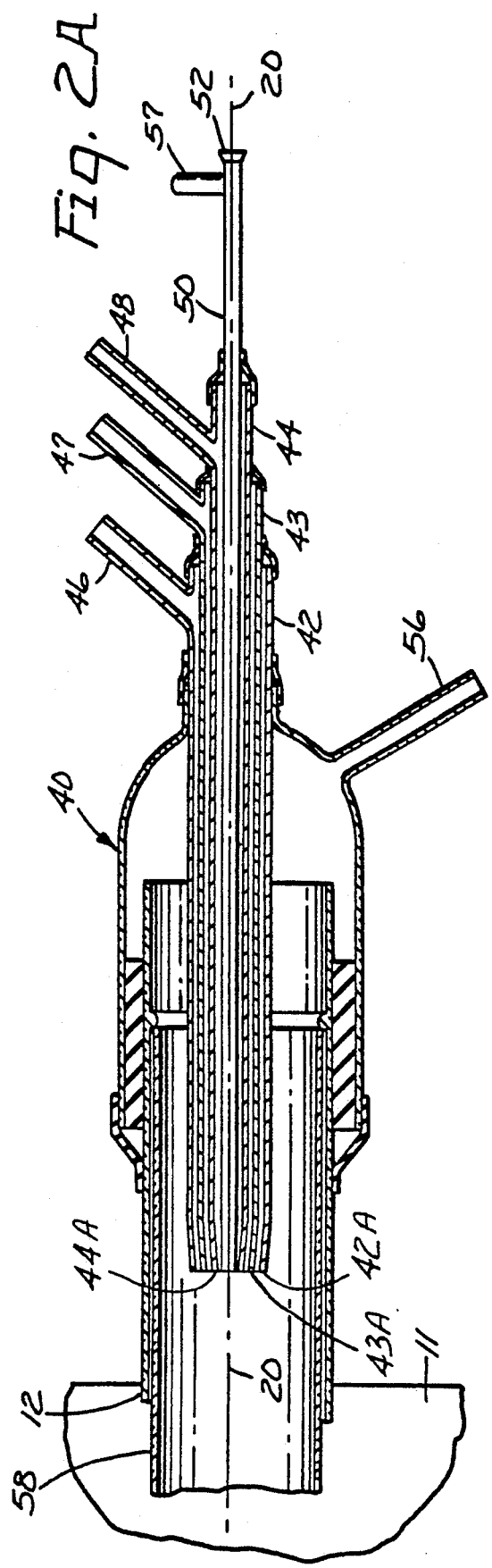
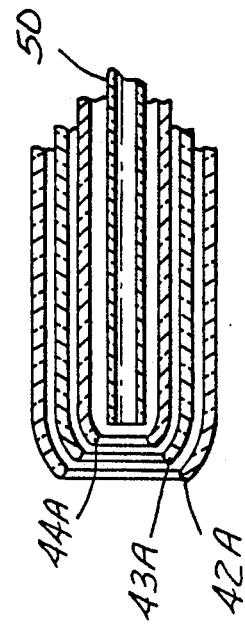

1μm

1μm

100 μm

1μm

200nm

10 μm

10 μm

CONTINUOUS METHOD OF COVERING INORGANIC FIBROUS MATERIAL WITH PARTICULATES

CROSS-REFERENCE TO RELATED APPLICATION

This application is a continuation-in-part of copending application Ser. No. 383,923 filed Jul. 21, 1989 which concerns the coating of fibrous material to make it more suitable for use as the reinforcing phase of composites. As there noted, the preparation and use of such composites can involve high temperatures that can cause the matrix of the composite to react chemically with, or dissolve, the fibrous material. That application discloses and claims method and apparatus by which barrier coatings can be continuously and economically applied by atmospheric pressure chemical vapor deposition (APCVD), both to protect the fibrous material and to improve the bond strength with the matrix.

FIELD OF THE INVENTION

The invention concerns high-performance inorganic fibrous material and, more specifically, concerns a method for covering such fibrous material with particulates such as whiskers in order to enhance the effectiveness of the fibrous material as the reinforcing phase in composites.

DESCRIPTION OF THE RELATED ART

During the preparation of fiber-reinforced composites, the filaments tend to align and agglomerate, especially when molten metal is used as the source of the matrix, so that the desired mechanical properties are not achieved. Even if the filaments were perfectly distributed, they may provide no reinforcement in transverse directions.

U.S. Pat. No. 3,580,731 (Milewski et al.) enhances the transverse strength of a composite that is reinforced by fiber bundles by growing whiskers on the individual fibrils of the fiber bundle to extend outwardly generally normal to the surface, thus providing reinforcements in three dimensions. While the individual fibrils may be about 10 $\mu$m in diameter, the whiskers are only about 0.01 to 1 $\mu$m in diameter.

U.S. Pat. No. 3,668,062 (Shyne et al.) is also concerned with increasing the transverse strength of fiber-reinforced composites, doing so with "three-dimensional whiskers" including "a principal, rigid, elongated single crystal whisker fiber having a plurality of secondary, relatively shorter length, single crystal whiskers appended along the length of each of the principal whiskers and disposed in a direction generally transverse the axis of each of the principal whiskers. In a second embodiment, the crystal whiskers may be characterized as a cluster ball of needle-like whiskers" (Abstract).

It is known that chemical vapor deposition (CVD) is suited for the preparation of particulates, and their formation can be a nuisance when continuous coatings are desired. For example, in parent application Ser. No. 383,923 soot (homogeneously nucleated and grown particles) that forms in the system during coating interferes with fiber movement and is periodically removed. Other deposition conditions can result in whisker formation, often by the VLS mechanism. U.S. Pat. No. 3,346,414 (Ellis et al.) describes the VLS technique which uses a liquid droplet that dissolves material depositing by CVD and allows the material to crystallize out in the shape of a circular crystal (whisker). A similar process yielding hollow whiskers, is described by Tibbetts et al., "Carbon Fibers Grown From the Vapor Phase: A Novel material," SAMPE Journal, September/October 1986, pages 30–35. While the whisker-growing agent in the Ellis process is a liquid droplet, that of the Tibbetts article can be in the solid phase.

EP Pat. Application 0,184,317 (Yetter et al.) which says that one may deposit iron nuclei from iron pentacarbonyl at 300° to 400° C. and then grow whiskers by pyrolyzing a hydrocarbon at 1000° to 1100° C.

Fast whisker growth may also be favored by pseudo-turbulent flow, as explained by Christiansen et al., "Turbulent Jets in Chemical vapor Deposition", Chemical Engineering Progress, December 1988, pp. 18–22. Regardless of whether the growth comprise powders, a mat of whiskers or platelets, the product can function in a composite to prevent the filaments of the fibrous material from aligning and agglomerating and may also afford transverse strength to the composite.

A CVD technique was used in Egashira et al.: "Preparation of Carbonaceous Material Whiskerized with Carbon Fibers (Part 3) . . . " Sekiyu Gakkaishi, Vol. 28, No. 5 (1985), p 412, which reports the growing of carbon whiskers on commercial polyacrylonitrile- and pitch-based carbon fibers and in FIG. 3 shows dense growths of whiskers.

U.S. Pat. No. 4,756,791 (D'Angelo et al.) describes formation of metal carbide or nitride whiskers. "The preferred substrate materials are nickel, or a high nickel alloy coated with TiC or TiN, or, for carbide whiskers, nickel impregnated graphite".

EP Pat. Application 0,249,927 (Yamada et al.) deposits short fibers, whiskers or powders onto continuous fibers by pulling a bundle of the fibers through a liquid in which the short fibers, whiskers or powders are suspended. The Yamada application says: "There is no specific restriction for the process used to deposit the powder, short fibers, and whiskers . . . and it is possible to use any conventional method, including, for example, electrodeposition, fluidizing bed, blowing and dipping in a suspension" (p. 7, lines 45–49). The resulting fibrous material is useful for improving the regularity of the fiber distribution in matrices and enhancing reinforcement of the composite, the matrix of which can be metal, plastic, or ceramic. Yamada says that deposition can be made more uniform by applying ultrasonic vibration to the suspension and that the coating bath can be agitated with a stirrer or gas may be blown through the coating bath.

The company to which the Yamada application is assigned (Ube Industries, Ltd.) markets fibrous material that may have been produced in accordance with the Yamada application. Two micrographs of that fibrous material are shown at page 3 of a brochure "Specialty Ceramics & Composites in Ube Group" (1988). The amounts of powder in one micrograph and of whiskers in the other are small.

U.S. Pat. No. 4,732,779 (Towata et al.) shows a process like that of the Yamada application and is based on earlier filed Japanese applications.

In U.S. Pat. No. 5,187,021, "Diamond and Ceramic Whiskers Grown on Diamond, Ceramic, or Metal Coated Fibers" (e.g. carbon, glass, ceramic, or metal fibers), the whisker-coated fibers are suitable for use in composites. In column 8, lines 10–17, it is explained that "The vacuum chamber 50 is composed of several stages 53, 55 and 57, each of increasing vacuum . . . A sufficient number of vacuum stages is provided to result in a vacuum in the final stage of approximately $1 \times 10^{-6}$ atmospheres." Also, in the paragraph bridging columns 10 and 11, the patent describes the use of an airlock. Thus, the process used is not an APCVD process.

SUMMARY OF THE INVENTION

The present invention provides what is believed to be the first method for continuously and economically covering inorganic fibrous material with particulates (i.e., powder particles, whiskers, and platelets).

While the examples of parent application Ser. No. 383,923 produced filmlike barrier coatings of substantially uniform thickness, the same apparatus can be used in the present invention for continuously covering inorganic fibrous material with particulates, simply by changing the deposition conditions. Crystalline whiskers can be continuously grown by the steps of:
  a) while excluding the ambient atmosphere, continuously carrying a length of inorganic fibrous material lengthwise through a heated gaseous mixture comprising one or more reagents under CVD conditions and in the presence of an agent for catalyzing the formation of whiskers,
  b) freely exhausting the post-reaction residue of said gaseous mixture along the path of the fibrous material in the direction of its movement,
  c) maintaining the moving fibrous material within said reaction zone for a time sufficient to effect the desired growth of whiskers on the fibrous material, and
  d) continuously removing the resulting whisker-bearing fibrous material from said reaction zone.

The apparatus of parent application Ser. No. 383,923 includes a furnace encompassing a furnace tube having an unconstricted outlet and an inlet through which the fibrous material barely fits in order to exclude the ambient atmosphere. As taught in the parent application, the furnace tube should have a uniform inside diameter, preferably from 2 to 5 cm. The furnace tube also has at least one intake for continuously supplying a flow of a gaseous mixture of reagents and of carrier gas(es). Because the apparatus can be operated at atmospheric pressure, there is no need for seals or for the supply and takeup reels to be contiguous with the furnace tube.

Depending on the composition of the gas stream and on the temperature, varying amounts of the deposit form as particulates or as continuous films on the fibrous material. In the parent application Ser. No. 383,923, conditions that favor the formation of films were taught and claimed. The present application teaches and claims conditions that not only lead to the formation of particulates, but also to their attachment to the fibrous material. During the process, the fibrous material may simultaneously receive a substantially continuous coating.

It may be desirable to apply a barrier coating to the fibrous material before covering it with particulates, and this can be carried out by APCFD in-line prior to the particulate-growing step. Doing so can (a) isolate the fibrous material from the matrix, (b) enhance the nucleation of the particulates, and (c) improve their adhesion to the fibrous material.

When the deposition of powder particles on the filaments is desired, one establishes conditions favorable for homogeneous nucleation and growth, namely high temperatures and high partial pressures of the reactants. Many of the powder particles become attached to the filaments by heterogenous growth.

Preferred particulates are whiskers, because they can interlock between adjacent fibers and thus significantly contribute to the transverse strength of a composite. For this reason, the average length of the whiskers preferably is at least 0.1 $\mu$m, and lengths of greater than 15 $\mu$m have been attained in this invention.

To illustrate the continuous CVD method for the growing of whiskers by the present invention, ferrocene which contains a catalyzing agent (iron) and carbon (cyclopentadiene) can be continuously added as a gas to a furnace tube to produce a mat of carbon-iron whiskers. One may saturate a carrier gas at the temperature needed to obtain the desired partial pressure and use heated gas lines to lead the gas mixture into the furnace tube. By also introducing a gaseous sream of SiCl$_4$, one obtains Fe-silicide-SiC whiskers.

With some precautions, ferrocene may instead be introduced as a solution. However, solvents of low vapor pressure should be avoided as these would cause the ferrocene to precipitate prior to it being discharged. Also, if the solution were to be discharged into a region where the temperature is below 173° C., the solvent would evaporate, and the ferrocene would accumulate as a solid. These difficulties have been avoided by using the high-boiling xylene as the solvent and adding the solution through a small diameter tube that discharged into the 120° C. region. The small diameter decreased heat exchange, and the fast flow also contributed to keeping the temperature of the solution low, thus also keeping the vapor pressure of the xylene low.

Another technique involves the deposition on fibrous material of a catalyzing agent or its precursor, by CVD or otherwise, prior to the particulate growing step. For example, in the novel method, nickel-containing nuclei can be deposited on a roving by pulling it through a NiCl$_2$ solution and drying it. Upon then pulling that roving through a continuously renewed gaseous atmosphere of TiCl$_4$, CH$_4$ and hydrogen, TiC whiskers and platelets are continuously grown on the individual filaments of the roving.

Certain deposition conditions have resulted in whiskers with novel characteristics. They are anchored to the filaments by catalytic particles. Such particles also occur periodically along their axes. Under some conditions the whiskers are hollow (see FIG. 7), under others they consist of bulk single crystals. The segments between the catalytic particles may be of differing compositions. In a few whiskers two compositions are present even in the same segment (see FIG. 8).

Depending on the strength of bond between particulates and filaments, some of the particulates may rub off the fibrous material during windup, preform preparation or weaving (if performed). As a countermeasure, one may apply sizing prior to the windup. Depending on the subsequent steps and on the composite desired, one may use a fugitive sizing, or apply as sizing, materials that can be transformed in situ into desired components of the matrix, e.g. solutions of pitch or of carbosilane.

The particulate-bearing fibrous material produced by the novel method is useful as the reinforcing phase in inorganic and organic matrices, i.e., metals, ceramics, glasses, carbon, and polymers. The particulates covering the fibrous material are preferably selected to be wettable by the matrix while being resistant to chemical reaction with or dissolution in it. Should the particulates not be compatible with the matrix, a barrier layer can be applied by APCVD to the particulate-bearing fibrous material by the method taught in parent application Ser. No. 383,923. The resulting barrier coating can protect both the particulates and the underlying fibrous material from direct contact with the matrix material and can also improve the adhesion between the particulates and the underlying fibrous material.

One aspect of the present invention is that such a barrier layer can be applied in the same step in which the particulates are formed. Alternatively, a barrier layer may be applied in-line by using a second APCVD apparatus similar to that illustrated in FIG. 6 of the parent application.

It is evident to those skilled in the art that the whiskers of this invention can be removed from substrates on which they have been grown, and then used as the reinforcing phase in composites.

Inorganic fibrous materials that can be used in the novel method can have various forms such as roving, yarn or a strip of woven fabric. Individual filaments of a roving tend to receive a fairly uniform covering of particulates, because they are not unduly constrained as they are drawn through the heated gaseous mixture. Accordingly, the filaments are separated to the extent that each can be covered with particulates. On the other hand, when the fibrous material is a yarn or a strip of fabric, its filaments and its fibers are in contact with each other to the extent that the particulates cannot completely encompass each filament.

BRIEF DESCRIPTION OF THE DRAWINGS

In the accompanying drawings, FIGS. 1, 2A and 2B of which are schematic and not drawn to scale, FIG. 1 is a side elevation of APCVD apparatus that is illustrated in parent application Ser. No. 383,923 and can also be used to carry out the method of the present invention;

FIG. 2A is a side elevation of equipment that can be substituted into the apparatus of FIG. 1. including three coaxial sleeves to establish a pseudoturbulent flow favoring the formation of particulates;

FIG. 2B is an enlarged breakaway view of the exits of the three coaxial sleeves shown in FIG. 2A;

DETAILED DESCRIPTION OF THE INVENTION

Figure 3:
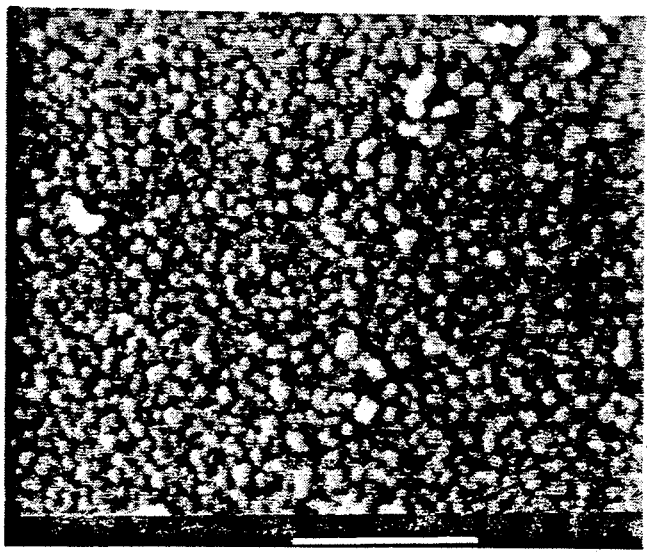
FIGS. 3—11 are photomicrographs of preferred particulates or particulate-covered fibrous material of the present invention.
Figure 4:
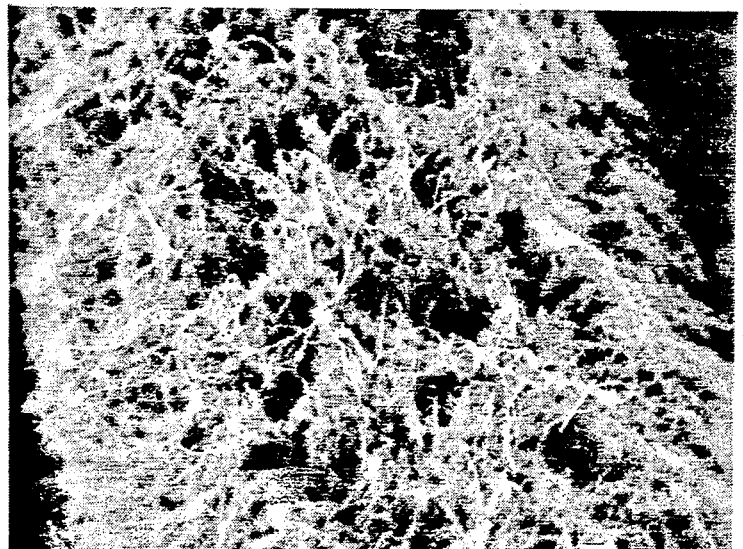
Figure 5:
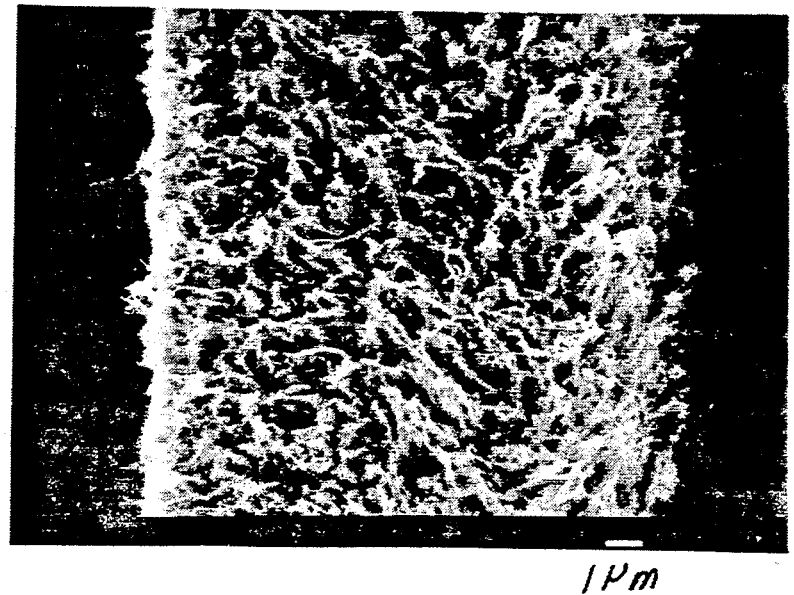

FIG. 1 shows a simple APCVD apparatus 10 that includes a cylindrical furnace 11 and a straight, elongated cylindrical quartz or mullite furnace tube 12 extending beyond the ends of the furnace. The furnace tube 12 has a uniform diameter throughout its length and is fitted with a cap 14 at its fiber-receiving inlet. Fitted into the cap is a long, cylindrical, small-diameter inlet tubing 16, and aligned with the inlet tubing is a supply roll 18 of a continuous tow 20. The inlet tubing 16 has a uniform inside diameter throughout its length and (except being flared outwardly at its entrance 22) is barely large enough to receive the tow. The furnace tube is unconstricted at its outlet 26. Upon exiting from the furnace tube, the tow 20 is drawn across a thread guide 23 and to a take-up roll 24.

The cap 14 is formed with a conduit 28 that can serve as an intake for a gaseous mixture including a reagent. The cap also is formed with a second conduit 30 that can serve as a port to feed a carrier gas such as argon into the furnace tube 12, which carrier gas may include additional reagent. The flux exiting through the unconstricted outlet 26 should be sufficient to minimize the back diffusion of air such that non-oxide growth can be attained with acceptable levels of oxygen contamination.

Deposition takes place not only on the tow 20 but also on the walls of the furnace tube 12. As the cross-sectional area of the furnace tube 12 is gradually decreased by such deposition and by fuzz and soot, the tow rubs more-and-more against the deposit, causing breakage of ever increasing numbers of the filaments until finally the tow breaks entirely, necessitating replacement of the furnace tube. However, to maintain acceptable reproducibility in the properties of the coatings, reproducible gas flow characteristics must also be maintained. It is therefore desirable to change the furnace tube before it becomes clogged and the fibrous material breaks. To avoid having to reattach the inlets, a removable liner 58 may be used as shown in FIG. 2. When the cross-sectional area of the liner 58 becomes too constricted by deposits, it can be replaced with minimal downtime.

The equipment shown in FIG. 2A can be substituted into the apparatus of FIG. 1. Fitted over the furnace tube 12 is a cap 40 into which are fitted three coaxial sleeves 42, 43, and 44. As shown in the enlarged breakaway view of FIG. 2B, the exits 42A, 43A, and 44A of the three coaxial sleeves 42, 43, and 44, respectively, direct the gaseous mixtures inwardly to create a pseudoturbulent flow of the gaseous atmosphere within the furnace tube 12, favorable to the formation of particulates. The outer and inner sleeves 42 and 44 are formed with conduits 46 and 48, respectively, each for receiving a gaseous mixture of a reactant. The central sleeve 43 has a conduit 47 for receiving inert gas.

Fitted within the inner sleeve 44 is a long, small-diameter cylindrical inlet tubing 50 that is flared outwardly at its entrance 52. The inlet tubing 50 has a uniform inside diameter barely larger than the tow 20 which is being carried through the APCVD apparatus. Each of the cap 40 and the inlet tubing 50 is formed with a conduit 56 and 57, respectively, for receiving inert gas.

FIGS. 3-11 are discussed in connection with the Examples.

Various modifications and alterations of this invention will become apparent to those skilled in the art without departing from the scope and spirit of this invention. Therefore, it should be understood that this invention is not to be limited to the following examples.

EXAMPLES

Example 1

In this example, the apparatus was like that of FIG. 1 having

| | |
|---|---|
| length of furnace 11: | 30 cm |
| inside diameter of furnace tube 12: | 2.5 cm |
| inside diameter of inlet tubing 16: | 0.4 cm |

A mixture of HCl (680 $cm^3$/min) and nitrogen (230 $cm^3$/min) was passed through a column containing zirconium sponge (>4#; Atlantic Equipment Engineers, N.J.) at 250° C., and the resulting gas mixture was introduced into the apparatus through the conduit 30. Both the connecting gas line and the cap 14 were kept with heating tape above the condensation temperature of ZrCl$_4$. A mixture of CO (750 cm$^3$/min) and CO$_2$ (240 cm$^3$/min) entered the system through conduit 28. The apparatus was used to coat a 2000-denier, 760-filament roving (mullite with a 2 w. % B$_2$O$_3$ content available as NEXTEL ® 480) that had a 0.2 w. % carbon coating. While the roving was pulled through the furnace tube (kept at 1050° C.) at 30 cm/min, zirconia powder particles formed by homogeneous nucleation and growth, and became attached to the filaments by heterogeneous growth as 40 to 80 nm crystallites. An SEM micrograph of the deposited crystallites is shown in FIG. 3.

Example 2

Nitrogen (840 cm$^3$/min) was passed through a ferrocene-filled saturator that was heated in an oil bath to 144° C. At the exit, a mixture of hydrogen (500 cm$^3$/min) and nitrogen (80 cm$^3$/min) was added to produce a gas stream that was introduced into apparatus like that of FIG. 1 through the conduit 28. Both the connecting line and the cap 14 were kept by heating tape above the condensation temperature of ferrocene. The second conduit 30 was purged with nitrogen (80 cm$^3$/min). NEXTEL ® 480 roving was pulled through the 900° C. reactor at 60 cm/min. Between the outlet 26 and the take-up roll 24, a water-based sizing of polyethylamine and a wax was applied, and the roving was passed over a hotplate for drying. A SEM micrograph (FIG. 5) of an unsized sample shows one of the filaments with a mat of deposited whiskers. TEM micrographs reveal that the whiskers grow out of ball-shaped catalytic particles that are anchored to the filaments. These particles are shown by selected area diffraction to be Fe$_3$C. The whiskers are hollow and consist of graphite lamellae oriented perpendicular to the whisker growth direction. In a TEM micrograph (FIG. 7), the catalytic particles appear periodically along the axes, with the whiskers that grew around them.

Example 3

The whisker-bearing roving of Example 2 was overcoated with SiC as a barrier layer using the method of Example 1 of the parent application Ser. No. 383,923, except that the pulling rate was increased to 75 cm/min.

Example 4

Figure 10:
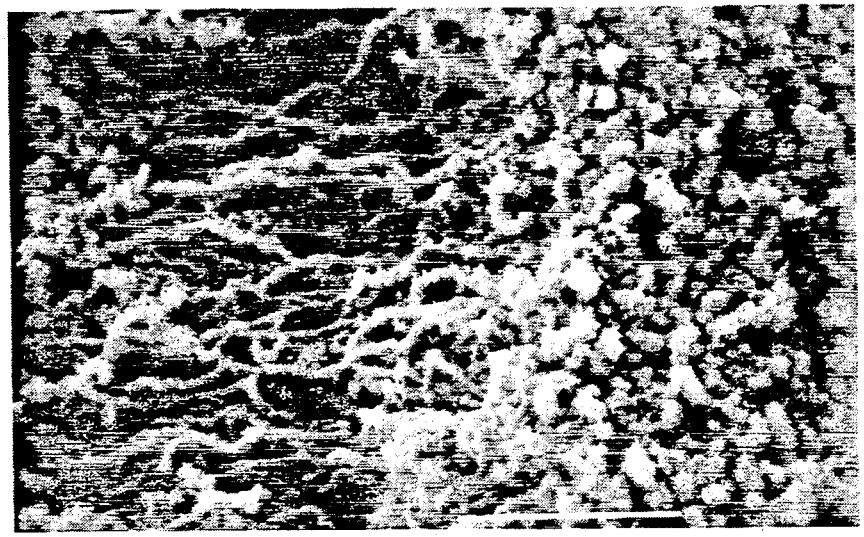
Figure 11:
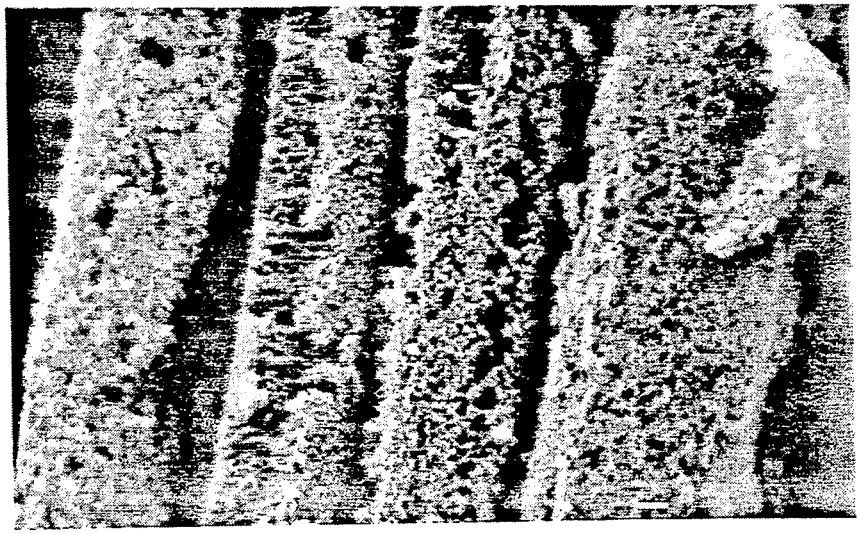

The process described in Example 2 was repeated except that the reactor temperature was 1200° C. Four whisker-bearing filaments are shown in the SEM micrograph of FIG. 11. Part of the mat of whiskers became scraped off the second filament from the left. An enlarged view of that area is shown in FIG. 10. Of all the examples, the mat of this example is the densest and the whiskers are the longest (>15 µm). The perimeter of the mat of whiskers is covered by homogeneously nucleated and grown soot particles. The whisker-bearing roving retains 100% of its original strand strength. As indicated by TEM, the whiskers are follow and are similar in appearance to those shown in FIG. 7.

Example 5

The process described in Example 4 was repeated except that "Thornel" (P100-S-2K from Amoco) graphite roving was substituted for the NEXTEL ® 480 roving. The whiskers have a low aspect ratio. The roving retains 92% of its original strand strength.

Example 6

Through a small diameter tube (1.6 mm ID), xylene containing 7.5 w/v. % ferrocene was introduced at 0.5 g/min into the 120° C. zone of an APCVD apparatus. A mixture of hydrogen (680 cm$^3$/min) and nitrogen (1060 cm$^3$/min) entered the reactor through a side inlet. The temperature of the furnace was 900° C. A NEXTEL ® 480 roving was pulled through the reactor at a rate of 60 cm/min. The SEM micrograph of the coated roving was similar to the one shown in FIG. 5. The roving turned black and its filaments were covered with slightly magnetic whiskers. Upon heating in air, the whisker-bearing roving turned brownish red, indicating the oxidation of iron in the whiskers.

Example 7

The whisker-bearing roving prepared according to Example 6 was placed in water and kept in an ultrasonic bath for one hour. A SEM micrograph (FIG. 4) after air-drying shows a mat of whiskers that are somewhat bunched.

Example 8

Nitrogen (425 cm$^3$/min) was passed through a ferrocene-filled saturator that was heated in an oil bath to 144° C. At the exit, hydrogen (680 cm$^3$/min) was added to the gas stream, and the resultant gaseous flow was introduced into apparatus like that of FIG. 1 through the conduit 28. Both the connecting line and the cap 14 were kept above the condensation temperature of ferrocene by heating tape. A stream of hydrogen (66 cm$^3$/min) was saturated with SiCl$_4$ at room temperature. Hydrogen (680 cm$^3$/min) was added to it, and the combined stream was introduced through the second conduit 30. After pyrolyzing the sizing of a THORNEL roving (P55-S 2K from Amoco), it was pulled through the furnace tube at 1200° C. and at 60 cm/min, and whiskers were grown on the roving. XRD indicates graphitized carbon[100], $\beta$-SiC[22] and Fe$_5$Si$_3$[20].

SEM micrographs (comparisons of secondary and backscatter micrographs) and TEM micrographs (selected area diffraction) reveal these whiskers are bulk single crystals and that some of them consist of single crystals of $\beta$-SiC; others of single crystals of Fe-silicide. Still others consist of segments of each of the compositions or both compositions in one segment.

Figure 8:
Figure 9:
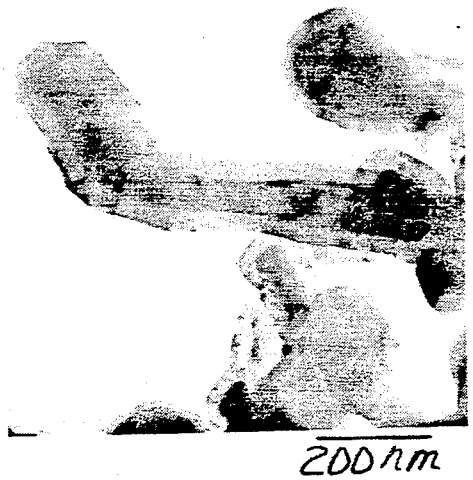

FIG. 8 shows a whisker that changes growth direction where a catalyzing particle is reformed. In the new segment, the two compositions appear to grow parallel to each other. Many of the whiskers do not have catalytic particles at their ends, as is illustrated in the TEM micrograph of FIG. 9. These whiskers became overcoated with a 30 nm barrier layer of graphite in the same operation.

The whisker-bearing roving retained 85% of its original strand strength.

Example 9

Nitrogen (425 cm$^2$/min) was passed through a tetraethoxy silane (TEOS) containing bubbler at 100° C. Nitrogen (230 cm$^3$/min) was added to the gaseous mixture through a "tee", and the resultant flow was passed into apparatus like that of FIG. 1 through the conduit 28. The transfer line and cap 14 were kept above the condensation temperature of TEOS. Air (420 cm$^3$/min) was introduced through the second conduit 30. While the furnace was heated to 700° C., a Hercules graphite roving (AS4-G-12K) was pulled through the furnace tube at 45 cm/min. Doing so increased the electrical resistance of the roving (as measured by contacting a 2.5 cm segment with probes) from about 40Ω/m to about 16 kg/m. This suggests that the roving had become coated with a thin barrier layer of $SiO_2$. The $SiO_2$-coated roving was overcoated with a mat of whiskers according to the procedure described in Example 2.

Example 10

A 1.0 w. % carbon coated NEXTEL® 480 roving was pulled through a 2 w/v. % aqueous solution of $NiCl_2.6H_2O$, and dried prior to windup. The roving was then pulled through apparatus like that of FIG. 1 at 40 cm/min while hydrogen (1.5 l/min) saturated with $TiCl_4$ at room temperature was introduced through the conduit 28, and $CH_4(1):Ar(4)$ was fed at 40 cm³/min through the conduit 30. At 1100° C. both whiskers and platelets formed on the filaments. EDAX shows a strong titanium signal, indicating that these particulates are TiC.

Example 11

Figure 6:
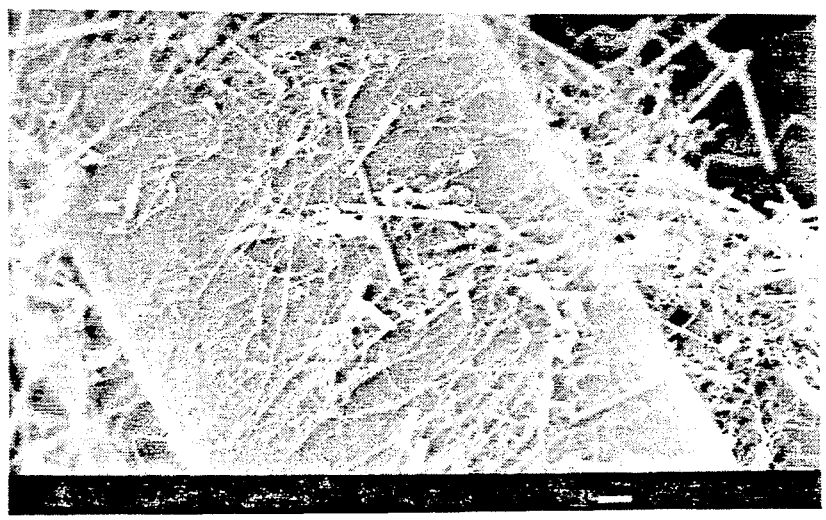
Figure 7:
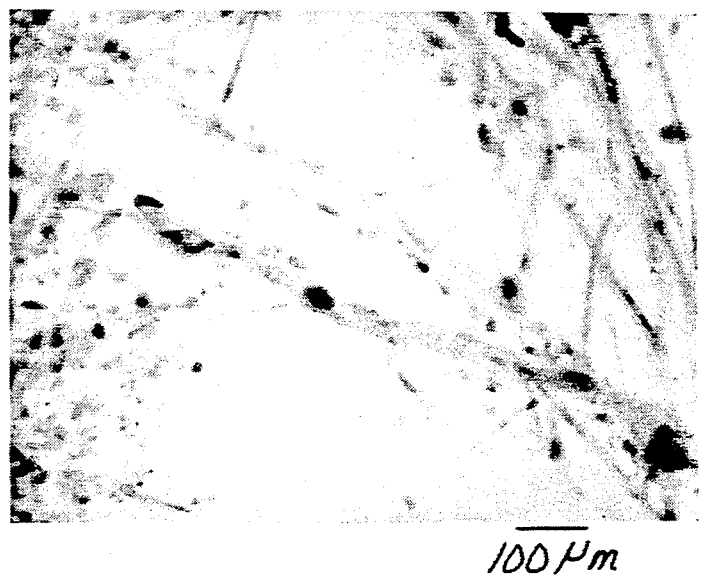

Through inlets 46, 47 and 48 of the apparatus shown in FIG. 2 were passed at room temperature, respectively, hydrogen (1700 cm³/min), nitrogen (500 cm³/min) and nitrogen (150 cm³/min) saturated with $SiCl_4$. A stream of nitrogen (230 cm³/min) was introduced through inlet 56. Nitrogen was also introduced at inlet 57. Lightly carbon-coated NEXTEL® 480 roving was passed through the reactor at 30 cm³/min. FIG. 6 shows the $Si_3N_4$ whiskers grown on one of the filaments. When the process was repeated under identical conditions except that the exit of the inlet system consisted, of straight tubes (as in FIG. 4 of parent application Ser. No. 383,923), the only deposit was a continuous $Si_3N_4$ layer.

What is claimed is:

1. Method of continuously growing whiskers on inorganic fibrous material, said method comprising the steps of:
   a) while excluding the ambient atmosphere, continuously carrying a length of inorganic fibrous material lengthwise through a heated gaseous mixture comprising one or more reagents under atmospheric pressure CVD conditions and in the presence of an agent for catalyzing the formation of whiskers,
   b) freely exhausting the post-reaction residue of said gaseous mixture along the path of the fibrous material in the direction of its movement,
   c) maintaining the moving fibrous material within said heated gaseous mixture for a time sufficient to effect the desired growth of whiskers on the fibrous material, and
   d) continuously removing the resulting whisker-bearing fibrous material from said reaction zone.

2. Method as defined in claim 1 wherein said fibrous material is selected from a roving of filaments, a tow of filaments, a yarn, and a strip of woven fabric.

3. Method as defined in claim 1, wherein said catalyzing agent is applied to the fibrous material before it is exposed to said heated gaseous mixture.

4. Method as defined in claim 3, wherein the fibrous material is drawn through a solution of material that leads to the deposition of said catalyzing agent or its precursor.

5. Method as defined in claim 4 wherein said solution contains dissolved $NiCl_2$.

6. Method as defined in claim 1 wherein said gaseous mixture includes a vapor which reacts under CVD conditions to produce said catalyzing agent.

7. Method as defined in claim 6 wherein said vapor comprises ferrocene.

8. Method as defined in claim 7 wherein the ferrocene is continuously fed into the heated gaseous mixture as a gas.

9. Method as defined in claim 7 wherein the ferrocene is continuously fed into the heated gaseous mixture in solution.

10. Method as defined in claim 1 wherein step c) also involves the deposition of a barrier coating on the whiskers.

11. Method as defined in claim 1 wherein step d) is followed by the step of applying a CVD coating to the whisker-bearing fibrous material.

12. Method as defined in claim 1, which method is preceded by the application of a CVD barrier coating to the fibrous material.

13. Method as defined in claim 12 wherein said fibrous material is selected from ceramics and carbon.

14. Method of continuously depositing powder particles on inorganic fibrous material, said method comprising the steps of:
   a) while excluding the ambient atmosphere, continuously carrying a length of inorganic fibrous material lengthwise through a heated gaseous mixture comprising one or more reagents under atmospheric pressure CVD conditions favoring homogeneous nucleation and growth of powders particles and attachment and heterogeneous growth of many of these particles on the fibrous material,
   b) freely exhausting the post-reaction residue of said gaseous mixture along the path of the fibrous material in the direction of its movement,
   c) maintaining the moving fibrous material within said reaction zone for a time sufficient to effect the covering of particles on the fibrous material, and
   d) continuously removing the resulting particle-bearing fibrous material from said reaction zone.

15. Method as defined in claim 14 wherein the gaseous mixture is at high temperature and contains reactants at high partial pressures.

* * * * *

UNITED STATES PATENT AND TRADEMARK OFFICE
CERTIFICATE OF CORRECTION

PATENT NO.: 5,322,711

DATED: June 21, 1994

INVENTOR(S): Gabor et al.

It is certified that error appears in the above-identified patent and that said Letters Patent is hereby corrected as shown below:

Col. 2, line 14, "vapor" should be --Vapor--.

Col. 9, line 5, "16 kg/m" should be --16 k$\Omega$/m--.

Signed and Sealed this

Thirteenth Day of June, 1995

*Attest:*

BRUCE LEHMAN

*Attesting Officer*     *Commissioner of Patents and Trademarks*